United States Patent [19]
Okano et al.

[11] Patent Number: 5,751,597
[45] Date of Patent: May 12, 1998

[54] CAD APPARATUS FOR LSI OR PRINTED CIRCUIT BOARD

[75] Inventors: Mitsunobu Okano; Yasuhiro Yamashita, both of Kawasaki, Japan

[73] Assignee: Fujitsu Limited, Kawasaki, Japan

[21] Appl. No.: 699,208

[22] Filed: Aug. 19, 1996

Related U.S. Application Data

[63] Continuation of Ser. No. 290,602, Aug. 15, 1994, abandoned.

[51] Int. Cl.$^6$ .................................................... G06F 17/50
[52] U.S. Cl. ........................... 364/491; 364/490; 364/489
[58] Field of Search ................................. 364/488, 489, 364/490, 491

[56] References Cited

U.S. PATENT DOCUMENTS

| | | | |
|---|---|---|---|
| 4,970,664 | 11/1990 | Kaiser et al. | 364/488 |
| 5,038,294 | 8/1991 | Arakawa et al. | 364/491 |
| 5,151,868 | 9/1992 | Nishiyama et al. | 364/490 |
| 5,198,986 | 3/1993 | Ikeda et al. | 364/489 |
| 5,243,547 | 9/1993 | Tsai et al. | 364/578 |
| 5,247,455 | 9/1993 | Yoshikawa | 364/490 |
| 5,361,214 | 11/1994 | Aoki | 364/490 |

*Primary Examiner*—Vincent N. Trans
*Attorney, Agent, or Firm*—Staas & Halsey

[57] ABSTRACT

A CAD apparatus for designing wires for an LSI or a printed circuit board is improved in that it can detect and determine a wire which is very probably influenced by crosstalk noise accurately in a short time and allows to make it clear how to modify wires. The CAD apparatus comprises a CAD execution section for designing wires, a display section for displaying a wire condition designed by the CAD execution section, and a display control section for controlling the displaying condition of the display section. The display control section controls the display section to display wire patterns of wires on the LSI or the printed circuit board obtained by designing of wires by the CAD execution section as well as the signal propagation directions of the individual wires.

15 Claims, 7 Drawing Sheets

○ PIN OR VIA HOLE
— PATTERN
dr DRIVER PIN
rc RECEIVER PIN
→ SIGNAL PROPAGATION DIRECTION

--- PATTERN IN DIFFERENT LAYER

◎ DIRECTION TOWARD THIS SIDE
☆ DIRECTION TOWARD THE OTHER SIDE

— PATTERN OF AIMED WIRE
— PATTERN OF OPPOSITE DIRECTION WIRE
— NON-OBJECT PATTERN
▒ NOISE INFLUENCE RANGE

— PATTERN OF AIMED WIRE
— PATTERN OF OPPOSITE DIRECTION WIRE
--- PATTERN OF OPPOSITE DIRECTION WIRE IN ANOTHER LAYER

◇ VIA HOLE FOR AIMED WIRE
◆ VIA HOLE FOR OPPOSITE DIRECTION WIRE

CAD APPARATUS FOR LSI OR PRINTED CIRCUIT BOARD

This application is a continuation of application Ser. No. 08/290,602, filed Aug. 15, 1994, now abandoned.

BACKGROUND OF THE INVENTION

1) Field of the Invention

This invention relates to a CAD (Computer-Aided Design) apparatus for designing wires for an LSI or a printed circuit board including a multi-chip module.

2) Description of the Related Art

In recent years, as miniaturization and of the speed of a computer have increased, an analysis of noise of an LSI or a printed circuit board used in the inside of a computer makes one of most critical subjects to be solved.

To this end, various simulation apparatus (software) have been provided, and simulation by a simulation apparatus is performed for a result of designing of wires of an LSI or a printed circuit board by means of a CAD apparatus to analyze noise. However, since a very long time is required for analysis processing with such an analysis conducted using a simulation apparatus, a technique for obtaining an effective result of processing in a short time is demanded.

Meanwhile, according to an analysis technique of crosstalk noise by popular CAD apparatus which do not employ a simulation apparatus, a maximum parallel wire length which does not have an influence of noise upon wires even if the wires are wired adjacent and in parallel to each other is determined in advance, and checking of a wire length, that is, checking of crosstalk noise, is performed simply in accordance with the maximum parallel wire length. In particular, it is checked whether or not a result of designing of wires of an LSI or a printed circuit board obtained by a CAD apparatus includes a pair of wires which are wired in parallel to each other over a length greater than the maximum parallel wire length determined in advance, and when such wire portions of a length greater than the maximum parallel wire length are included, it is determined that crosstalk noise may possibly be produced at the wire portions.

The amount of influence of crosstalk noise described above is varied not only by a parallel wire length of a pair of adjacent wires but also by the directions of signals propagating in the pair of wires. In particular, even where wiring conditions of a pair of wires are same, the influence of crosstalk noise is different whether the propagation directions of signals in the pair of wires are same or opposite, that is, the influence of crosstalk when the propagation directions are opposite is higher than that when the propagation directions are same.

In the noise checking based on a maximum parallel wire length described above, however, the directions of signals flowing in adjacent wires are not taken into consideration, but the maximum parallel wire length is determined, in order to design on the safety side, on the assumption that the propagation directions of signals in each pair of adjacent wires are opposite, and noise checking is performed based on the maximum parallel wire length thus determined.

Accordingly, it is often the case that it is judged that a pair of wires, which are not actually influenced by crosstalk noise, that is, a pair of wires in which signals propagate in same directions, are influenced by crosstalk noise, and the distance between the wires is set rather great.

Particularly where wires are wired in a high density, if noise checking is performed severely as described above (that is, if it is assumed that the propagation directions of signals in all pairs of adjacent wires are same), then it is often determined that wires which are not actually influenced by noise are possibly influenced by noise. Accordingly, there is a subject to be solved in that accurate checking is difficult.

Further, where a noise analysis is conducted using a simulation apparatus as described above, there is a subject to be solved not only in that much time is required for designing of wires but also in that, even if it becomes clear from a result of the analysis by simulation that a pair of wires may possibly be influenced by noise, it cannot be known clearly how to modify the wring patterns.

SUMMARY OF THE INVENTION

It is an object of the present invention to provide a CAD apparatus for an LSI or a printed circuit board by which a wire which is likely to be influenced by crosstalk noise can be detected and determined accurately in a short time and it can be made clear how to modify wires.

In order to attain the object described above, according to an aspect of the present invention, there is provided a CAD apparatus for an LSI or a printed circuit board, which comprises CAD execution means for designing wires on an LSI or a printed circuit board, display means for displaying a wire condition designed by the CAD execution means, and display control means for controlling the displaying condition of the display means, the display control means controlling the display means to display wire patterns of wires on the LSI or the printed circuit board obtained by designing of wires by the CAD execution means as well as the signal propagation directions of the individual wires.

When the CAD execution means designs a wire which extends over a plurality of layers, the display control means may control the display means to display wire patterns of wires in the individual layers as well as the signal propagation directions in the individual wires. Or, when the CAD execution means designs a wire which extends to another layer through a via hole, the display control means may control the display means to display the signal propagation direction in the wire which extends through the via hole.

With the CAD apparatus for an LSI or a printed circuit board, the signal propagation directions of the individual wires can be displayed on the display means, and also the signal propagation direction of a wire on another layer (interlayer wire) or the signal propagation direction of a wire extending through a via hole can be displayed on the display means. Consequently, the designer can grasp it readily based on the thus displayed result which wire pattern is very probably influenced by crosstalk noise including the signal propagation direction, and can design wires of an LSI or a printed circuit board taking an influence of noise into consideration.

According to another aspect of the present invention, there is provided a CAD apparatus for an LSI or a printed circuit board, which comprises, in addition to CAD execution means, display means and display control means similar to those described above, wire information storage means for storing wire information including wire patterns of the wires on the LSI or the printed circuit board and signal propagation directions in the wires obtained by wire designing by the CAD execution means, noise influence range determination means for determining, based on the wire information of the wire information storage means, a noise influence range of a particular wire within which the particular wire has an influence of another wire, and search means for searching, based on the wire information of the wire information storage means, for another wire which is wired within the noise influence range of the particular wire determined by the noise influence range determination means, the display control means controlling the display means to display a wire pattern of the particular wire, a wire pattern of any other wire within the noise influence range of the particular wire searched out by the search means and signal propagation directions of the thus displayed wires.

The display control means may control the display means to display a wire pattern of any one of the wires within the noise influence range of the particular wire whose signal propagation direction is opposite to the signal propagation direction of the particular wire.

When the CAD execution means designs wires over a plurality of layers, the search means may search, based on the wire information of the wire information storage means, for a wire of another layer wired in the noise influence range of the particular wire, and the display control means may control the display means to display a wire pattern of any wire of the another layer within the noise influence range of the particular wire searched out by the search means and a signal propagation direction of the searched out wire. In this instance, the display control means may control the display means to display a wire pattern of any one of the wires in the another layer within the noise influence range of the particular wire whose signal propagation direction is opposite to the signal propagation direction of the particular wire.

When the particular wire extends to another layer through a via hole, the search means may search, based on the wire information of the wire information storage means, for another via hole which is present within the noise influence range of the particular wire and through which another wire extends, and the display control means may control the display means to display the via hole through which the particular wire extends, any via hole within the noise influence range of the particular wire searched out by the search means and signal propagation directions of the particular wire and the wire which extends through the via hole. In this instance, the display control means may control the display means to display any via hole within the noise influence range of the particular wire through which a wire whose signal propagation direction is opposite to the signal propagation direction of the particular wire extends.

With the CAD apparatus for an LSI or a printed circuit board, a wire pattern of a particular wire (aimed wire) and a via hole through which the wire extends, another wire which is present within the noise influence range of the particular wire, a wire extending between different layers (interlayer wire) and a via hole through which the wire extends, and the signal propagation directions of such wires can be displayed on the display means. Accordingly, it can be made clear in what manner which wire should be modified, and the designer can readily grasp a wire or a via hole in which the signal propagation direction is opposite to that of the particular wire and which has a particularly high influence of noise on the particular wire. Accordingly, wire designing of an LSI or a printed circuit board can be performed taking an influence of noise into consideration.

According to a further aspect of the present invention, there is provided a CAD apparatus for an LSI or a printed circuit board, which comprises, in addition to CAD execution means and wire information storage means similar to those described above, conversion parallel wire length calculation means for calculating, based on the wire patterns and the signal propagation directions of the wires stored in the wire information storage means, for each of the wires, conversion parallel wire lengths regarding the wire of any other wire which is wired adjacent and in parallel to the wire taking a signal propagation direction into consideration, and check means for performing noise checking of each the wires based on the conversion parallel wire length calculated by the conversion parallel wire length calculation means.

The CAD apparatus for an LSI or a printed circuit board may further comprise noise influence range determination means and search means similar to those described above, and the conversion parallel wire length calculation means may calculate, for each of the wires, the conversion parallel wire length regarding any other wire within the noise influence range searched out by the search means. In this instance, the conversion parallel wire length calculation means may multiply an actual parallel wire length regarding each of the wires of any other wire wired adjacent and in parallel to the wire by a first coefficient set in accordance with a distance between the wire and the other wire and a second coefficient set in accordance with the relationship of signal propagation directions of the wire and the other wire to calculate the conversion parallel wire length.

With the CAD apparatus for an LSI or a printed circuit board, since a conversion parallel wire length of each wire is calculated taking the signal propagation direction as well as the noise influence range and the distance to another wire into consideration and crosstalk noise checking can be performed based on the conversion parallel wire length, such a situation that a wire which is not influenced by noise is determined to be probably influenced by noise is eliminated, and a wire which is very probably influenced by crosstalk noise can be detected and determined accurately in a short time. Consequently, the designer can grasp it readily in what manner which wire should be modified.

Further objects, features and advantages of the present invention will become apparent from the following detailed description when read in conjunction with the accompanying drawings in which like parts or elements are denoted by like reference characters.

DESCRIPTION OF THE PREFERRED EMBODIMENT

Figure 1:
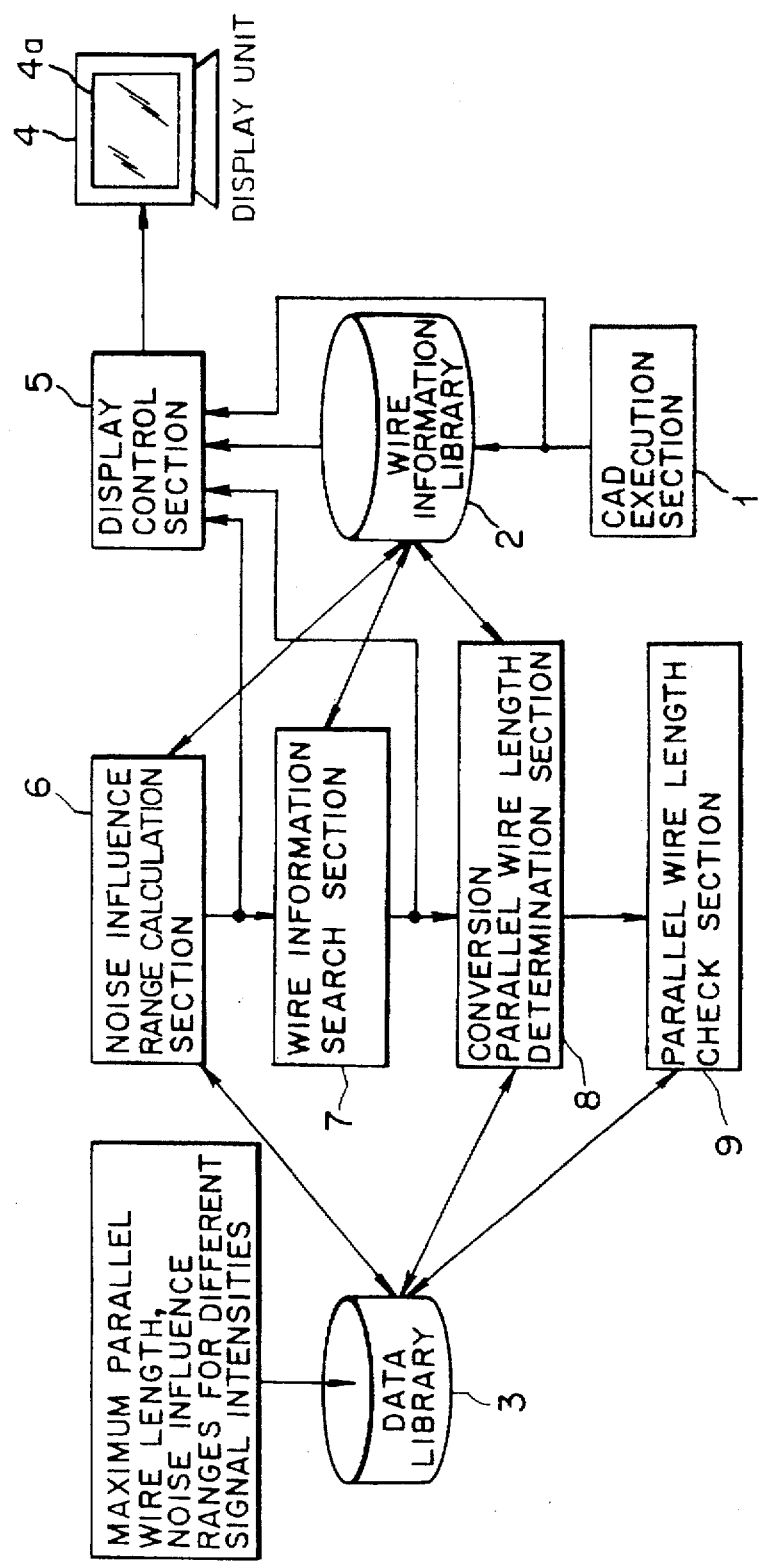
FIG. 1 is a block diagram of a CAD apparatus for an LSI or a printed circuit board showing a preferred embodiment of the present invention.

Referring first to FIG. 1, there is shown a CAD apparatus for an LSI or a printed circuit board according to a preferred embodiment of the present invention. The CAD apparatus shown includes a CAD execution section (CAD execution means) 1 for designing wires on an LSI or a printed circuit board, and a wire information library (wire information storage means) 2 for storing wire information including wire patterns of wires on an LSI or a printed circuit board and signal propagation directions in the wires obtained by designing of wires by the CAD execution apparatus 1.

The CAD apparatus further includes a data library 3 in which various data including a maximum parallel wire length and noise influence ranges for different signal intensities (for example, voltages) are stored in advance. Here, the maximum parallel wire length is a maximum length over which an influence of noise is not had upon any of a pair of wires which are wired adjacent and in parallel to each other. Meanwhile, the noise influence range is a range within which a certain wire can have an influence upon another wire (for example, the distance from an adjacent wire), and such ranges of wires for different signal intensities are set as a table or a function in the data library 3.

The CAD apparatus further includes a display unit (display means) 4 for displaying a wire condition designed by the CAD execution section 1, wire information of the wire information library 2 and so forth on a screen 4a, and a display control section (display control means) 5 for controlling a displaying condition of the display unit 4.

The display control section 5 has a function of causing the screen 4a of the display unit 4 to display thereon wire patterns of wires obtained by wiring designing by the CAD execution section 1 as well as signal propagation directions of the wires based on wire information from the CAD execution section 1 and wire information from the wire information library 2 during wiring designing or after completion of wiring designing by the CAD execution section 1. The display control section 5 also has another function of causing the screen 4a of the display unit 4 to display thereon, when wiring designing for a plurality of layers is performed by the CAD execution section 1, wire patterns of wires of the layers as well as signal propagation directions in the wires and a further function of causing the screen 4a of the display unit 4 to display thereon, when wires are designed by the CAD execution section 1 such that they extend through via holes to another layer, signal propagation directions of the wires extending through the via holes.

Figure 6:
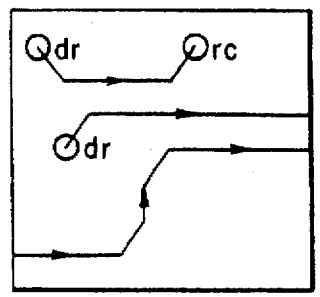
FIG. 6 is a diagrammatic view showing an example of a display of of wire patterns and signal propagation directions by the CAD apparatus of FIG. 1.
Figure 7:
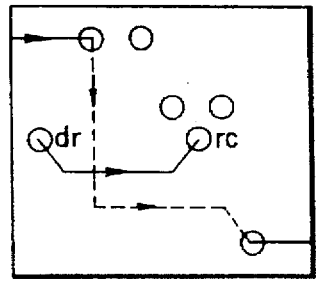
FIG. 7 is a similar view but showing an example of a display of a wire pattern of another layer and signal propagation directions by the CAD apparatus of FIG. 1.
Figure 8:
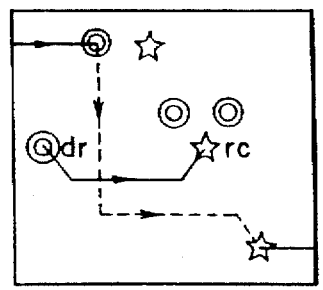
FIG. 8 is a similar view but showing an example of a display of via holes through which wires pass and signal propagation directions in the via holes by the CAD apparatus of FIG. 1.

Such displays, for example, as shown in FIGS. 6 to 8 are provided on the screen 4a of the display unit 4 by the functions of the display control section 5 described above.

In particular, on the screen 4a shown in FIG. 6, a pin of a part disposed on an LSI or a printed circuit board or a via hole formed to extend through such printed circuit board between the front and rear faces for allowing connection between wires of different layers is indicated by the mark "○", and if the pin is a driver pin, then "dr" is indicated, but if the pin is a receiver pin, then "rc" is indicated, additionally to the mark ○. Further, a wire pattern of a wire is indicated by a thin solid line with an arrow mark indicating a signal propagation direction.

Meanwhile, on the screen 4a shown in FIG. 7, "○", "dr" and "rc" are displayed similarly as in FIG. 6 and a wire pattern of a wire on the front face is indicated by a thin solid line with an arrow mark indicative of a signal propagation direction while a wire pattern of another wire wired to the rear face (another layer) through a via hole is indicated by a thin dotted line with an arrow mark indicative of a signal propagation direction.

Further, on the screen 4a shown in FIG. 8, wire patterns of a wire on the front face and another wire on the rear face are indicated by a thin solid line and a thin dotted line, respectively, each with an arrow mark indicating a signal propagation direction similarly as in FIG. 7, and besides, a signal propagation direction through a via hole through which a wire extends is indicated by "⊙" at the position of the via hole where the signal propagates to the nearer side from the screen 4a but by "☆" at the position of the via hole where the signal propagates to the farther side of the screen 4a.

Referring back to FIG. 1, the CAD apparatus further includes a noise influence range calculation section (noise influence range determination means) 6 which obtains a signal intensity (voltage) of an aimed wire (particular wire) from the wire information of the wire information library 2 and applies the signal intensity to noise influence range information stored in the data library 3 corresponding to signal intensities to determine a noise influence range within which the aimed wire can have an influence of another wire.

The CAD apparatus further includes a wire information search section (search means) 7 which searches the wire information of the wire information library 2 for another wire (wire pattern) wired within the noise influence range of the particular wire determined by the noise influence range determination section 6. Further, the wire information search section 7 in the present embodiment has a function of searching, when wires are designed for a plurality of layers by the CAD execution section 1, the wire information of the wire information library 2 for a wire of another layer wired within the noise influence range of the particular wire and another function of searching, where the aimed wire extends to another layer through a via hole, for another via hole which is present within the noise influence range of the particular wire and through which another wire extends.

Thus, the display control section 5 in the present embodiment also has a function of causing the screen 4a of the display unit 4 to display thereon a wire pattern of an aimed wire, a wire pattern of another wire within the noise influence range of the aimed wire pattern searched out by the wire information search section 7 and signal propagation directions in the wires. The display control section 5 in the present embodiment further has a function of causing, when wires are designed for a plurality of layers by the CAD execution section 1, the screen 4a of the display unit 4 to display thereon a wire pattern of a wire of another layer within the noise influence range of the aimed wire searched out by the wire information search section 7 and a signal propagation direction in the wire and another function of causing the screen 4a of the display unit 4 to display, where the aimed wire extends to another layer through a via hole, the via hole through which the aimed wire extends, another via hole within the noise influence range of the aimed wire searched out by the wire information search section 7 and signal propagation directions in the wires extending through the via holes.

In this instance, the display control section 5 in the present embodiment causes the screen 4a of the display unit 4 to display thereon wire patterns of those wires of other wires and wires in other layers within the noise influence range of the aimed wire in which the signal propagation directions are opposite to the signal propagation direction in the aimed wire and those of via holes within the noise influence range through which wires in which the signal propagation directions are opposite to the signal propagation direction in the aimed wire extend.

Figure 9:
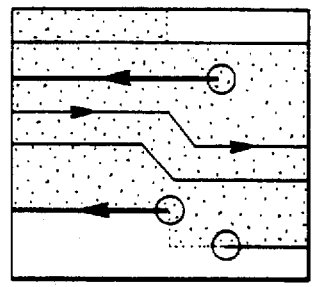
FIG. 9 is a similar view but showing an example a display of wire patterns within a noise influence range and signal propagation directions by the CAD apparatus of FIG. 1.
Figure 10:
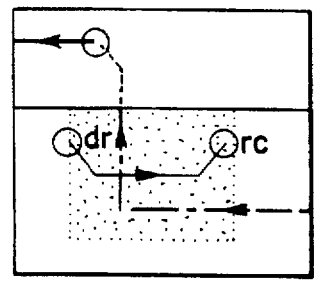
FIG. 10 is a similar view but showing an example of a display of another wire pattern in another layer within a noise influence range and signal propagation directions by the CAD apparatus of FIG. 1.
Figure 11:
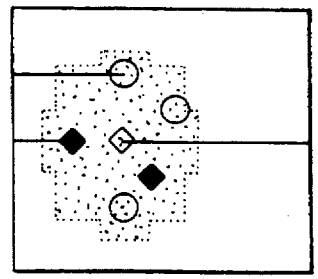
FIG. 11 is a similar view but showing an example of a display of via holes through which wires pass within a noise influence range and signal propagation directions by the via holes in the CAD apparatus of FIG. 1.

Such displays as shown, for example, in FIGS. 9 to 11 are provided on the screen 4a of the display unit 4 by the functions of the display control section 5 described above.

In particular, on the screen 4a shown in FIG. 9, a wire pattern of an aimed wire is displayed by a solid line with an arrow mark indicative of a signal propagation direction, and the noise influence range of the aimed wire pattern is displayed by a meshed area. Further, a wire pattern of another wire within the noise influence range in which the signal propagation direction is opposite to the signal propagation direction in the aimed wire is displayed by a thick solid line with an arrow mark indicative of a signal propagation direction. In the screen 4a, while a thin solid line indicates a wire which does not make an object for noise checking, such as, for example, a wire pattern of another wire in which the signal propagation direction is same as the signal propagation pattern in the aimed wire, an arrow mark indicative of a signal propagation direction may be added to such wire pattern.

Meanwhile, on the screen 4a shown in FIG. 10, a wire pattern of an aimed wire (wire pattern) and the noise influence range of the aimed wire are displayed similarly as in FIG. 9, and a wire pattern in another layer (on the rear face) within the noise influence range in which the signal propagation direction is opposite to the signal propagation direction in the aimed wire pattern is indicated by a combination of a thick chain line and a thin dotted line with an arrow mark indicative of a signal propagation direction.

Further, on the screen 4a shown in FIG. 11, a via hole through which an aimed wire extends is indicated by "◇", and the noise influence range of the via hole is indicated by a meshed area. Further, another via hole in the noise influence range through which another wire in which the signal propagation direction is opposite to the signal propagation direction in the aimed wire extends is indicated by Referring back again to FIG. 1, the CAD apparatus further includes conversion parallel wire length calculation section (conversion parallel wire length calculation means) 8 which calculates, for each wire, a conversion parallel wire length $L_C$ of the wire relative to another adjacent wire extending in parallel to the wire taking signal propagation directions into consideration based on the wire patterns of the wires and the signal propagation directions of the wires in the wire information library 2.

The CAD apparatus further includes a parallel wire length check section (check means) 9 which compares a conversion parallel wire length $L_C$ calculated by the conversion parallel wire length calculation section 8 with the maximum parallel wire length stored in the data library 3 to effect crosstalk noise checking of each wire. It is to be noted that a result of the crosstalk noise checking by the parallel wire length check section 9 is, for example, displayed on the screen 4a of the display unit 4.

Here, the conversion parallel wire length calculation section 8 in the present embodiment calculates, as hereinafter described in detail with reference to FIGS. 2 to 5, for each wire, a conversion parallel wire length $L_C$ regarding another wire (including a wire in another layer) within the noise influence range of the wire searched out by the wire information search section 7.

More particularly, where a plurality of other wires are present within the noise influence range of a certain wire, the conversion parallel wire length $L_C$ of the certain wire is calculated by the conversion parallel wire length calculation section 8 and is given as a sum total of conversion parallel wire lengths for the individual other wires which are each given as a product among an actual parallel wire length with respect to the certain wire, a first coefficient a which is set in accordance with a wire distance, that is, the distance between the other wire in question and the certain wire and a second coefficient b which is set in accordance with the relationship between the signal propagation directions in the wire in question and the certain wire.

It is to be noted that, where no other wire is present in the noise influence range of the aimed wire, the conversion parallel wire length naturally is zero. Meanwhile, where only one other wire is present in the noise influence range of the aimed wire, there is no need of calculating such a sum total as mentioned above, and a conversion parallel wire length regarding the single other wire is the conversion parallel wire length of the aimed wire as it is.

The conversion parallel wire length calculation section 8 calculates a conversion parallel wire length $L_C$ for each of wires on an LSI or a printed circuit board in such a manner as described above.

Here, the first coefficient a decreases as the wire distance increases (the influence of noise decreases as the wire distance increases). Meanwhile, the second coefficient b has a predetermined value b1 when the signal propagation direction in the adjacent wire is opposite, but has another predetermined value b2 (<b1; the influence of noise is higher where the signal propagation direction is opposite) when the signal propagation direction is same. The first and second coefficients a and b are set as tables or functions, for example, in the data library 3 or some other component.

Figure 3:
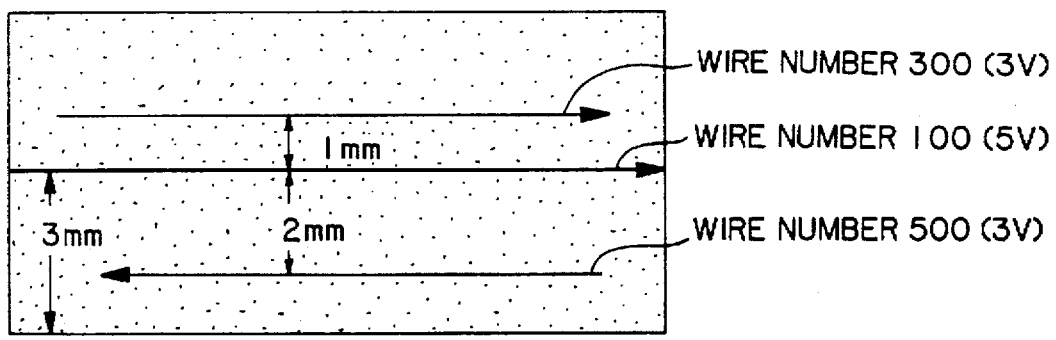
FIG. 3 is a diagrammatic view showing an example of a wire which makes an object for noise checking of the CAD apparatus of FIG. 1.
Figure 5:
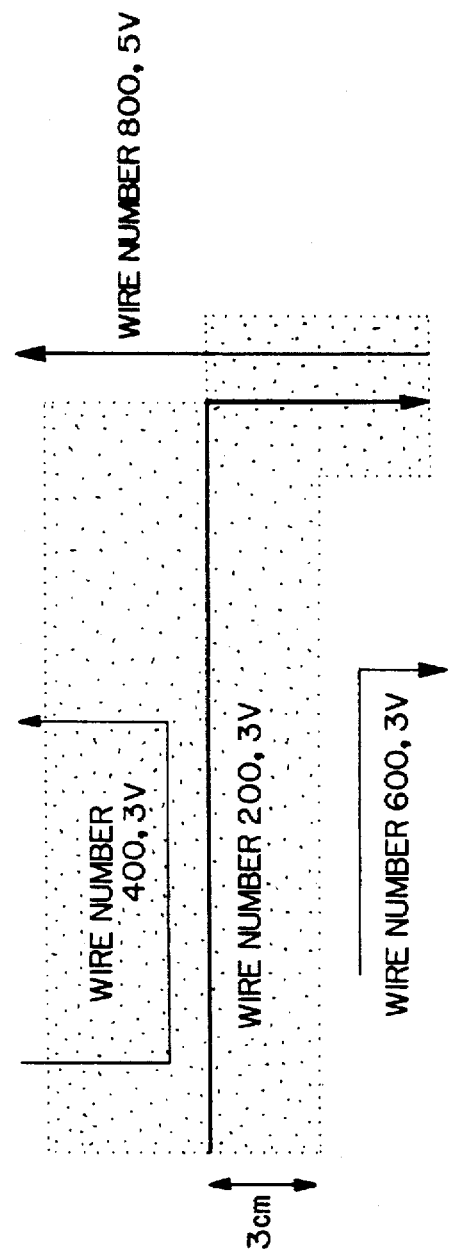
FIG. 5 is a diagrammatic view showing another example of a wire which makes an object for noise checking of the CAD apparatus of FIG. 1.

FIGS. 3 and 5 show different examples of a wire on a printed circuit board which makes an object for noise checking.

In FIG. 3, three signal wires of wire numbers 300, 100 and 500 are shown. As seen in FIG. 3, the signal intensity of the wire of the wire number 300 is 3 V; the signal intensity of the wire of the wire number 100 is 5 V; and the signal intensity of the wire of the wire number 500 is 3 V. Further, the distance between the wire of the wire number 100 and the wire of the wire number 300 is 1 mm; and the distance between the wire of the wire number 100 and the wire of the wire number 500 is 2 mm.

In FIG. 5, four signal wires of wire numbers 200, 400, 600 and 800 are shown. As seen in FIG. 5, the signal intensity of the wire of the wire number 200 is 3 V; the signal intensity of the wire of the wire number 400 is 3 V; the signal intensity of the wire of the wire number 600 is 3 V; and the signal intensity of the wire of the wire number 800 is 5 V.

FIGS. 3 and 5 show, for example, multi-layer printed circuit boards in which different layers of the wires are interconnected through via holes. Further, FIGS. 3 and 5 show display conditions on the screen 4a of the display unit 4 as they are, and in FIGS. 3 and 5, a meshed portion indicates the noise influence range of the wire of the wire number 100 or 200 indicated by a thick line, and an arrow mark added to the wire pattern of each wire indicates the signal propagation direction in the wire.

Figure 2:
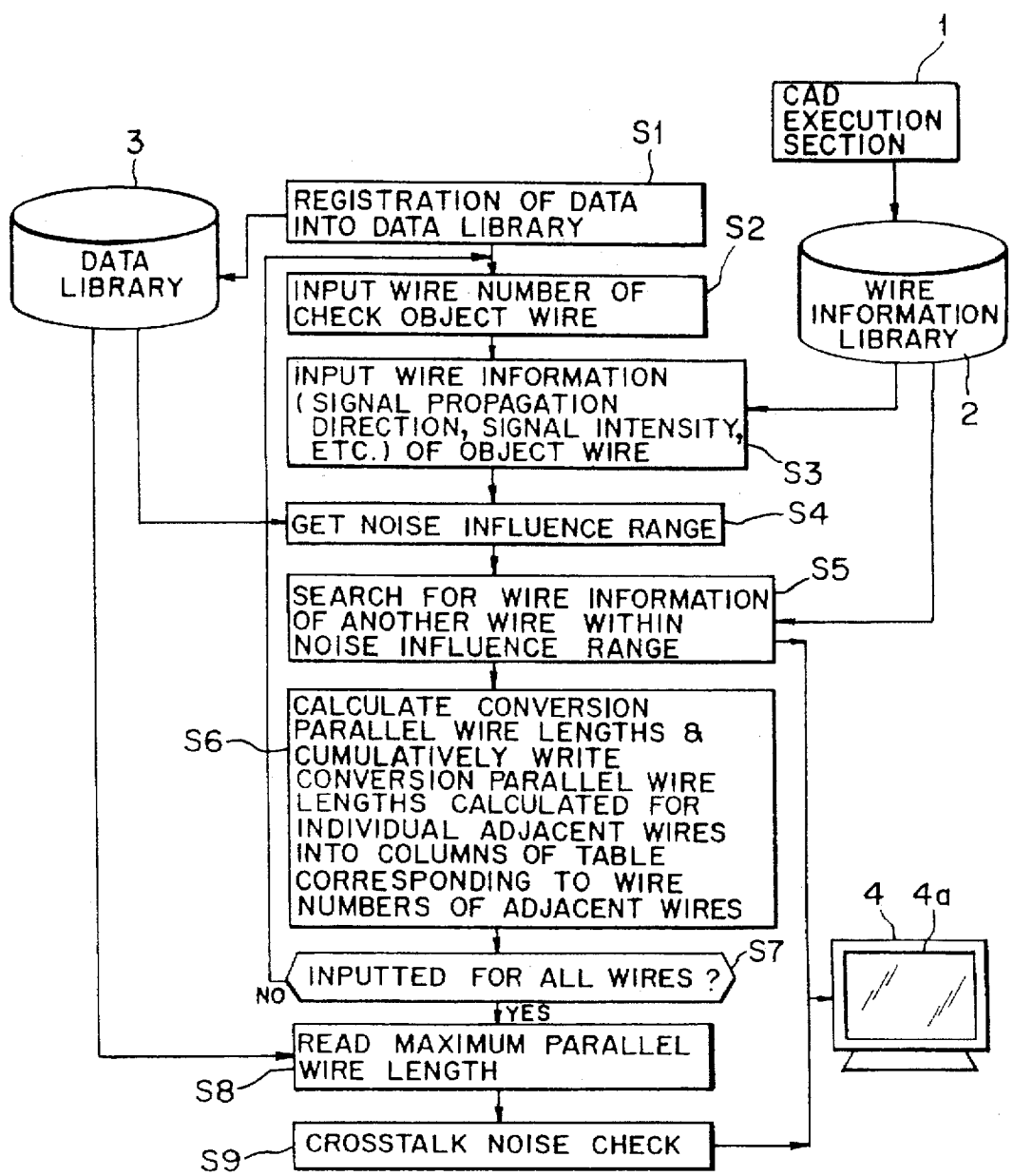
FIG. 2 is a flow chart illustrating an example of operation of the CAD apparatus of FIG. 1.

Subsequently, operation of the CAD apparatus in the present embodiment for the wires of the printed circuit board shown in FIG. 3 will be described first with reference to the flow chart shown in FIG. 2. It is to be noted that FIG. 2 illustrates an example of operation when crosstalk noise checking is performed at a time for all wires on a printed circuit board designed for wiring by the CAD execution section 1.

First at step S1, a maximum parallel wire length which does not provide an influence of noise and noise influence ranges for different signal intensities (voltages) of a wire are determined and registered into the data library 3. In this instance, also the first coefficient a and the second coefficient b which are required for calculation of a conversion parallel wire length $L_C$ by the conversion parallel wire length calculation section 8 are determined and stored into the data library 3.

Then, a wire on the printed circuit board which makes an object for subsequent crosstalk noise checking is designated in terms of its wire number and is inputted as an aimed wire (aimed wire or particular wire) to the CAD apparatus of the present embodiment (step S2). Here, it is assumed that, for example, the wire number 100 in FIG. 3 is first designated and inputted.

Wire information which is a result of designing of wires by the CAD execution section 1 is registered in advance in the wire information library 2, and when the wire number which makes an object for noise checking is inputted, wire information of the aimed wire, for example, information of the signal propagation direction, the signal intensity and so forth, is inputted from the wire information library 2 to the noise influence range determination section 6 (step S3).

The noise influence range determination section 6 thus searches the data library 3 in accordance with the signal intensity of the aimed wire obtained as wire information from the wire information library 2 to determine a noise influence range within which the aimed wire can have an influence on another wire (step S4), and the wire information search section 7 searches the wire information of the wire information library 2 for other wires which are present in the noise influence range of the aimed wire determined by the noise influence range determination section 6 and fetches wire information (signal propagation directions and so forth) of the thus searched out wires (step S5).

Since the signal intensity of the wire, for example, of the wire number 100 shown in FIG. 3 is 5 V, the noise influence range determination section 6 gets a noise influence range of a wire whose signal intensity is 5 V from the data library 3, and the wire information search section 7 searches for wires within the noise influence range. As a result, wire information of the wires of the wire number 300 and the wire number 500 is searched out as seen from FIG. 3.

The result of searching by the wire information search section 7 is displayed in such a condition as shown, for example, in FIG. 3 (or in any of such conditions as shown in FIGS. 6 to 11) on the screen 4a of the display 4 under the control of the display control section 5. The designer can thus grasp, based on the displayed result, signal propagation directions on the same face or on the different faces (front and rear faces) or in via holes, wires within the noise influence range and so forth.

Thereafter, the conversion parallel wire length calculation section 8 calculates a conversion parallel wire length $L_C$ of the wire of an object for checking regarding the other wires within the noise influence range of the wire of an object for checking in accordance with the wire information from the wire information search section 7 taking the signal propagation directions into consideration (step S6). The conversion parallel wire length $L_C$ is calculated in the following manner.

When, for example, the wire of the wire number 100 shown in FIG. 3 is the wire of an object for checking and the wire numbers of the wires within the noise influence range of the wire are 300 and 500, an actual parallel wire length (actual parallel wire length) $L_{R\ (1-3)}$ between the wire of the wire number 100 and the wire of the wire number 300, a wire distance $D_{1-3}$ between the wires, and information of whether the signal propagation directions of the wires are same or opposite (the relationship between the signal propagation directions) are first determined based on the wire information searched out from the wire information library 2 by the wire information search section 7.

Then, a first coefficient as which depends upon the wire distance $D_{1-3}$ thus determined and a second coefficient $b_3$ which depends upon the relationship between the signal propagation directions of the wires are read out, for example, from the data library 3 and determined, and a conversion parallel wire length $L_{C\ (1-3)}$ between the wire of the wire number 100 and the wire of the wire number 300 is calculated in accordance with a following equation (1):

$$L_{C\ (1-3)} = a_3 \times b_3 \times L_{R\ (1-3)} \tag{1}$$

Here, the first coefficient as and the second coefficient $b_3$ are set in quite similar manners as described above in connection with the first coefficient a and the second coefficient b, respectively.

Similarly, an actual parallel wire length (actual parallel wire length) $L_{R\ (1-5)}$ between the wire of the wire number 100 and the wire of the wire number 500, a wire distance $D_{1-5}$ between the wires, and the relationship between the signal propagation directions are first determined, and then a first coefficient $a_5$ which depends upon the wire distance $D_{1-5}$ thus determined and a second coefficient $b_5$ which depends upon the relationship between the signal propagation directions of the wires are determined, whereafter a conversion parallel wire length $L_{C\ (1-5)}$ between the wire of the wire number 100 and the wire of the wire number 500 is calculated in accordance with a following equation (2):

$$L_{C\ (1-5)} = a_5 \times b_5 \times L_{R\ (1-5)} \tag{2}$$

Here, the first coefficient as and the second coefficient $b_5$ are set in quite similar manners as described above in connection with the first coefficient a and the second coefficient b, respectively.

On the other hand, a table for writing sums of the conversion parallel wire lengths for the individual wire numbers is prepared in advance in the conversion parallel wire length calculation section 8, and after the conversion parallel wire lengths $L_{C\ (1-5)}$ and $L_{C\ (1-5)}$ are calculated for the individual wires adjacent the checking object wire within the noise influence range as described above, the conversion parallel wire lengths $L_{C\ (1-3)}$ and $L_{C\ (1-5)}$ are written into columns of the table corresponding to the wire numbers 300 and 500 and cumulatively to the conversion parallel wire lengths to the respective values written there precedently.

The processing operations at steps S2 to S6 described above are performed repetitively until they are completed for all of the wires on the printed circuit board which is the object for noise checking (until the determination at step S7 changes to YES) to calculate the conversion parallel wire lengths of the wires on the printed circuit board and add the thus calculated conversion parallel wire lengths to the conversion parallel wire lengths in the columns of the table corresponding to the respective wire numbers.

When the processing for all of the wires on the printed circuit board is completed in this manner (determination of YES at step S7), the conversion parallel wire lengths $L_C$ of the wires of the individual wire numbers are written in the individual columns of the table of the conversion parallel wire length calculation section 8 corresponding to the respective wire numbers.

Then, the parallel wire length check section 9 reads out the maximum parallel wire length from the data library 3 (step S8) and compares the maximum parallel wire length with the conversion parallel wire lengths $L_C$ of the wire numbers written in the individual columns of the table to check to determine that any of the wires whose conversion parallel wire length $L_C$ exceeds the maximum parallel wire length is a wire which is very probably influenced by crosstalk noise (step S9). The result of checking (the wire whose conversion parallel wire length $L_C$ exceeds the maximum parallel wire length and the wire number of the wire) is displayed, for example, on the screen 4a of the display unit 4.

Figure 4:
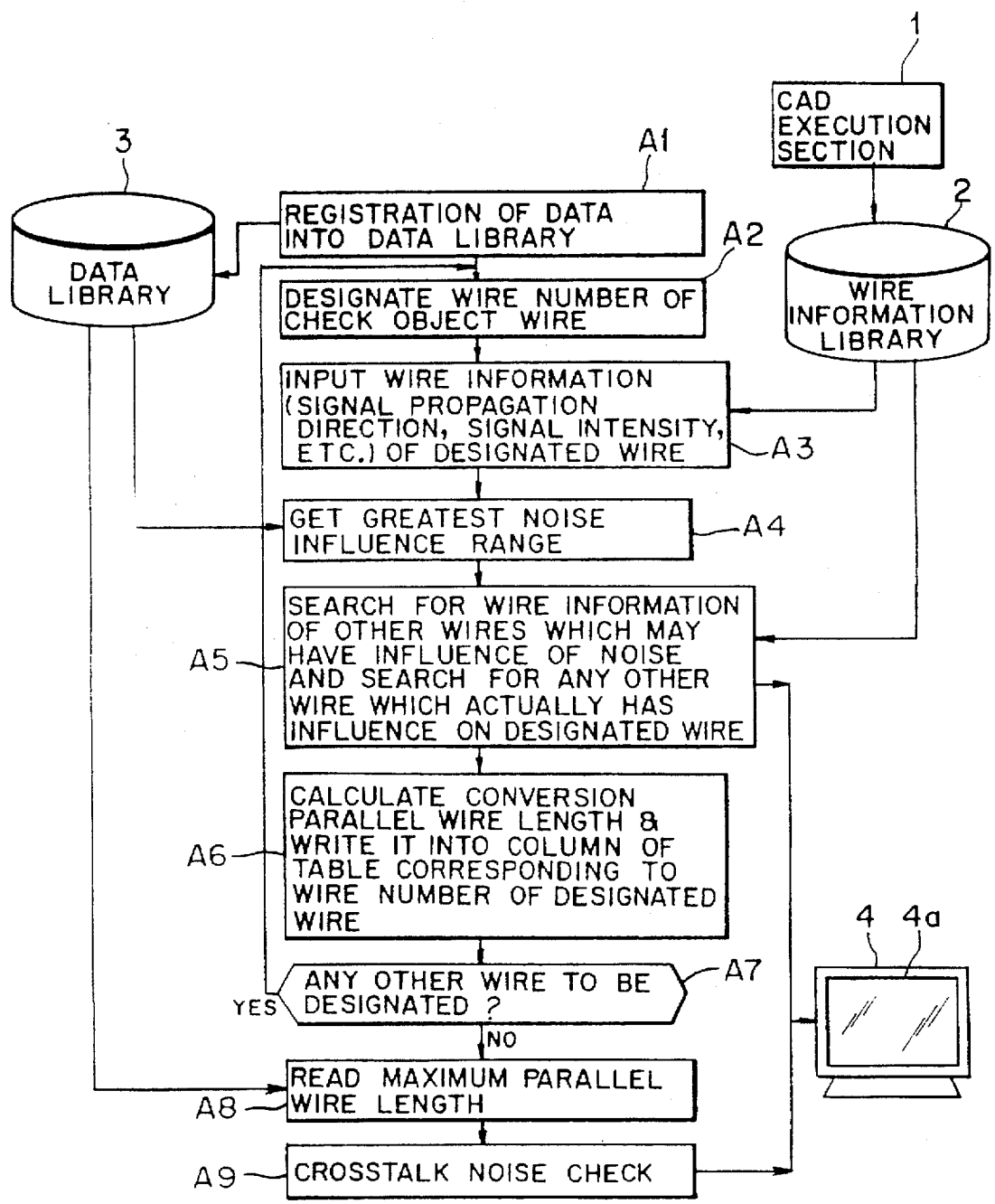
FIG. 4 is a flow chart illustrating another example of operation of the CAD apparatus of FIG. 1.

Subsequently, operation of the CAD apparatus of the present embodiment for wires of a printed circuit board shown in FIG. 5 will be described with reference to the flow chart of FIG. 4. It is to be noted that FIG. 4 illustrates an example of operation when crosstalk noise checking of each wire on a printed circuit board is performed, different from the case of FIG. 2, designating the wires one by one.

First at step A1, a maximum parallel wire length, noise influence ranges for different signal intensities of a wire, a first coefficient a, a second coefficient b and so forth are determined and stored into the data library 3 similarly as at step S1 in FIG. 2.

Then, a wire which makes an object for crosstalk checking is designated in terms of a wire number and inputted to the CAD apparatus of the present embodiment (step A2). Here, for example, the wire number 200 in FIG. 5 is designated and inputted.

After the wire which makes an object for noise checking is designated, wire information (signal propagation direction, signal intensity and so forth) of the wire is inputted from the wire information library 2 to the noise influence range determination section 6 (step A3) similarly as at step S3 in FIG. 2.

The noise influence range determination section 6 thus searches the data library 3 for a greatest noise influence range (step A4). Then, the wire information search section 7 searches the wire information of the wire information library 2 for other wires which can have an influence of noise upon the designated wire (other wires which are present within the greatest noise influence range described above), and fetches the wire information (signal propagation directions, signal intensities and so forth) of the thus searched out wires, whereafter it searches for those wires which actually have an influence on the designated wire based on the thus fetched signal intensities (step A5). It is to be noted that the function of the noise influence range determination section 6 described above is used at step A5.

When the greatest noise influence range is, for example, the range of 3 cm from the designated wire, the wires of the wire numbers 400 and 800 are searched out as candidates of other wires which may possibly have an influence upon the designated wire of the wire number 200 shown in FIG. 5. Then, the wire information search section 7 searches for those wires which actually have an influence upon the designated wire based on the signal intensities (voltages) of the wires thus searched out.

The result of searching by the wire information search section 7 is displayed in such a condition as shown, for example, in FIG. 5 (or in any of such conditions as shown in FIGS. 6 to 11) on the screen 4a of the display 4 under the control of the display section 5. Consequently, the designer can grasp, based on the thus displayed result, the signal propagation directions on a same face or in different layers (on the front and rear faces) or in via holes, other wires which have an influence upon the designated wire, and so forth.

Thereafter, the conversion parallel wire length calculation section 8 calculates conversion parallel wire lengths $L_C$ regarding the designated wire of those wires which have an influence on the designated wire as an object for checking based on the wire information from the wire information search section 7 taking the signal propagation directions into consideration (step A6). The conversion parallel wire lengths $L_C$ are each calculated in the following manner.

When, for example, the wire of the wire number 200 shown in FIG. 5 is a wire of an object for checking (designated wire) and the wire numbers of those wires which having an influence on the designated wire are 400 and 800, an actual parallel wire length (actual parallel wire length) $L_R$ (2-4) between the designated wire of the wire number 200 and the wire of the wire number 400, a wire distance $D_{2-4}$ between the wires, and information of whether the signal propagation directions of the wires are same or opposite (the relationship between the signal propagation directions) are first determined based on the wire information searched out from the wire information library 2 by the wire information search section 7.

Then, a first coefficient $a_4$ which depends upon the wire distance $D_{2-4}$ thus determined and a second coefficient $b_4$ which depends upon the relationship between the signal propagation directions of the wires are read out, for example, from the data library 3 and determined, and a conversion parallel wire length $L_C$ (2-4) between the designated wire of the wire number 200 and the wire of the wire number 400 is calculated in accordance with a following equation (3):

$$L_{C\ (2-4)} = a_4 \times b_4 \times L_{R\ (2-4)} \qquad (3)$$

Here, the first coefficient $a_4$ and the second coefficient $b_4$ are set in quite similar manners as described above in connection with the first coefficient a and the second coefficient b, respectively.

Similarly, an actual parallel wire length (actual parallel wire length) $L_{R\ (2-8)}$ between the designated wire of the wire number 200 and the wire of the wire number 800, a wire distance $D_{2-8}$ between the wires, and the relationship between the signal propagation directions are first determined, and then a first coefficient as which depends upon the wire distance $D_{2-8}$ thus determined and a second coefficient $b_8$ which depends upon the relationship between the signal propagation directions of the wires are determined, whereafter a conversion parallel wire length $L_C$ (2-8) between the designated wire of the wire number 200 and the wire of the wire number 800 is calculated in accordance with a following equation (4):

$$L_{C\ (2-8)} = a_8 \times b_8 \times L_{R\ (2-8)} \qquad (4)$$

Here, the first coefficient as and the second coefficient $b_8$ are set in quite similar manners as described above in connection with the first coefficient a and the second coefficient b, respectively.

On the other hand, a table for writing sums of the conversion parallel wire lengths for the individual wire numbers is prepared in advance in the conversion parallel wire length calculation section 8, and after the conversion parallel wire lengths $L_{C\ (2-4)}$ and $L_{C\ (2-8)}$ are calculated for the individual wires adjacent the checking object wire within the noise influence range as described above, the conversion parallel wire lengths $L_{C\ (2-4)}$ and $L_{C\ (2-8)}$ are cumulatively written into the column of the table corresponding to the wire number 200 to calculate the conversion parallel wire length $L_C$ ($=L_{C\ (2-4)}+L_{C\ (2-8)}$) of the designated wire of the wire number 200.

When crosstalk noise checking is performed for any other wire (when the determination at step A7 is YES), the processing operations at steps A2 to A6 described above are performed repetitively to calculate and write the conversion parallel wire length $L_C$ of the thus designated wire into the column of the table corresponding to the wire number.

When the processing for the designated wire or wires on the printed circuit board is completed in this manner (determination of NO at step S7), the conversion parallel wire length or lengths $L_C$ of the wire or wires of the wire number or numbers are written in the column or columns of the table of the conversion parallel wire length calculation section 8 corresponding to the wire or wires of the designated wire number or numbers.

Then, the parallel wire length check section 9 reads out the maximum parallel wire length from the data library 3 (step A8) and compares the maximum parallel wire length with the conversion parallel wire length or lengths $L_C$ of the wire number or numbers written in the column or columns of the table to check to determine that any of the wires whose conversion parallel wire length $L_C$ exceeds the maximum parallel wire length is a wire which is very probably influenced by crosstalk noise (step A9), similarly as at steps S8 and S9 in FIG. 2. The result of checking (the wire or wires whose conversion parallel wire length or lengths $L_C$ exceed the maximum parallel wire length and the wire number or numbers of the wire or wires) is displayed, for example, on the screen 4a of the display unit 4.

In this manner, with the CAD apparatus for an LSI or a printed circuit board of the present invention, since the signal propagation directions of individual wires can be displayed on the display unit 4 and also the signal propagation directions of wires extending between different layers and the signal propagation directions of wires extending through via holes can be displayed on the display unit 4, the designer can, upon designing of wires by means of the CAD execution section 1, grasp it readily based on the thus displayed result which one or ones of the wire patterns are very probably influenced by crosstalk noise including the signal propagation directions. Consequently, wire designing of an LSI or a printed circuit bard can be performed taking an influence of noise into consideration.

Further, a wire pattern of an aimed wire and a via hole through which the wire extends, another wire which is present within the noise influence range of the particular wire, a wire extending between different layers and a via hole through which the wire extends, and the signal propagation directions of such wires can be displayed on the display unit 4. Accordingly, it can be made clear in what manner which wire should be modified, and consequently, the designer can readily grasp a wire or a via hole in which the signal propagation direction is opposite to that of a particular wire and which has a particularly high influence of noise on the particular wire. Accordingly, wire designing of an LSI or a printed circuit board can be performed taking an influence of noise into consideration.

Furthermore, since a conversion parallel wire length $L_C$ of each wire is calculated taking the signal propagation direction as well as the noise influence range and the distance to another wire into consideration and crosstalk noise checking can be performed based on the conversion parallel wire length $L_C$, such a situation that a wire which is not influenced by noise is determined to be probably influenced by noise as in the prior art is eliminated, and a wire which is very probably influenced by crosstalk noise can be detected and determined accurately in a short time. Further, various other advantages can be achieved including the advantage that the designer can grasp it readily in what manner which wire should be modified.

It is to be noted that such a display of the display unit 4 as shown in any of FIGS. 6 to 11 can be provided not only during noise checking but also during wire designing by the CAD execution section 1 so that the designer can refer to the display to effect wire designing taking crosstalk noise into consideration. Further, such crosstalk noise checking as described above with reference to FIGS. 2 to 5 can be performed also during wire designing by the CAD execution section 1 so that the designer can refer to a result of checking and reflect the same on wire designing.

Further, while, in the embodiment described above, the present invention is applied to wire designing for a printed circuit board, the present invention can be applied also to wire designing for an LSI in a similar manner as described above, and similar advantages can naturally be achieved in this instance.

The present invention is not limited to the specifically described embodiment, and variations and modifications may be made without departing from the scope of the present invention.

What is claimed is:

1. A CAD apparatus for an LSI or a printed circuit board, comprising:

CAD execution means for designing physical layout of first and second wires on an LSI or a printed circuit board, wherein a portion of the first wire is adjacent to the second wire;

conversion calculation means for calculating a conversion wire length of the first wire with respect to the second wire from the length of the portion of the first wire adjacent to the second wire and respective propagation directions of the first and second wires;

display means for displaying the physical layout of the first and second wires designed by said CAD execution means, including the respective propagation directions of each wire; and display control means for controlling the display means to display the physical wire layout.

2. The CAD apparatus for an LSI or a printed circuit board as claimed in claim 1, wherein, when said CAD execution means designs a wire which extends over a plurality of layers, said display control means controls said display means to display wire patterns of wires in the individual layers as well as the signal propagation directions in the individual wires.

3. The CAD apparatus for an LSI or a printed circuit board as claimed in claim 1, wherein, when said CAD execution means designs a wire which extends to another layer through a via hole, said display control means controls said display means to display the signal propagation direction in the wire which extends through the via hole.

4. A CAD apparatus for an LSI or a printed circuit board, comprising:

CAD execution means for designing physical wires on an LSI or a printed circuit board;

wire information storage means for storing wire information including wire patterns of the physical wires on the LSI or the printed circuit board and signal propagation directions in the physical wires obtained through the wire designing by said CAD execution means;

display means for displaying the physical wires and the wire information stored in said wire information storage means which respectively corresponds to the physical wires;

display control means for controlling the displaying of said display means;

noise influence range determination means for determining, based on the wire patterns and signal propagation directions stored in said storage means, a noise influence range of a first physical wire which has an influence of a second physical wire; and search means for searching, based on the wire information stored in said wire information storage means, for a third physical wire which is wired within the noise influence range of the first physical wire;

said display control means controlling said display means to display a physical wire pattern of the first physical wire, a physical wire pattern of the third physical wire and respectively corresponding signal propagation directions of the thus displayed physical wires.

5. The CAD apparatus for an LSI or a printed circuit board as claimed in claim 4, wherein said display control means controls said display means to display a wire pattern of any one of the wires within the noise influence range of the particular wire whose signal propagation direction is opposite to the signal propagation direction of the particular wire.

6. The CAD apparatus for an LSI or a printed circuit board as claimed in claim 4, wherein, when said CAD execution means designs wires over a plurality of layers, said search means searches, based on the wire information of said wire information storage means, for a wire of another layer wired in the noise influence range of the particular wire, and said display control means controls said display means to display a wire pattern of any wire of the another layer within the noise influence range of the particular wire searched out by said search means and a signal propagation direction of the searched out wire.

7. The CAD apparatus for an LSI or a printed circuit board as claimed in claim 6, wherein said display control means controls said display means to display a wire pattern of any one of the wires in the another layer within the noise influence range of the particular wire whose signal propagation direction is opposite to the signal propagation direction of the particular wire.

8. The CAD apparatus for an LSI or a printed circuit board as claimed in claim 4, wherein, when the particular wire extends to another layer through a via hole, said search means searches, based on the wire information of said wire information storage means, for another via hole which is present within the noise influence range of the particular wire and through which another wire extends, and said display control means controls said display means to display the via hole through which the particular wire extends, any via hole within the noise influence range of the particular wire searched out by said search means and signal propagation directions of the particular wire and the wire which extend through the via holes.

9. The CAD apparatus for an LSI or a printed circuit board as claimed in claim 8, wherein said display control means controls said display means to display any via hole within the noise influence range of the particular wire through which a wire whose signal propagation direction is opposite to the signal propagation direction of the particular wire extends.

10. A CAD apparatus for an LSI or a printed circuit board, comprising:

CAD execution means for designing physical wires on an LSI or a printed circuit board;

wire information storage means for storing wire information including physical wire patterns of the physical wires on the LSI or the printed circuit board and signal propagation directions in the physical wires;

conversion parallel wire length calculation means for calculating, based on the physical wire patterns and the signal propagation directions of the physical wires stored in said wire information storage means, and for each of the physical wires, conversion parallel wire lengths regarding any other physical wire which is wired adjacent and in parallel to each of said physical wires, wherein the conversion parallel wire lengths vary with respect to the respective signal propagation directions; and check means for performing noise checking of each of the physical wires based on respectively corresponding conversion parallel wire lengths calculated by said conversion parallel wire length calculation means.

11. The CAD apparatus for an LSI or a printed circuit board as claimed in claim 10, further comprising:

noise influence range determination means for determining, based on the wire information of said wire information storage means, a noise influence range of each of the wires within which the wire has an influence upon any other wire; and search means for searching, based on the wire information of said wire information storage means, for any other wire wired in the noise influence range determined by said noise influence range determination means;

said conversion parallel wire length calculation means calculating, for each of the wires, the conversion parallel wire length regarding any other wire within the noise influence range searched out by said search means.

12. The CAD apparatus for an LSI or a printed circuit board as claimed in claim 11, wherein said conversion parallel wire length calculation means multiplies an actual parallel wire length regarding each of the wires of any other wire wired adjacent and in parallel to the wire by a first coefficient set in accordance with a distance between the wire and the other wire and a second coefficient set in accordance with the relationship of signal propagation directions of the wire and the other wire to calculate the conversion parallel wire length.

13. A CAD apparatus, comprising:

a CAD execution mechanism for designing a pattern of first and second physical wires on one of the group comprising an LSI and a printed circuit board, each physical wire having a corresponding signal propagation direction;

a display mechanism which displays the pattern of first and second physical wires designed by the CAD execution mechanism and corresponding signal propagation directions; and conversion calculation means for calculating a conversion wire length for said first wire with respect to said second wire, wherein said conversion wire length corresponds to a portion of said first wire which is adjacent to the second wire multiplied by factor which corresponds to signal propagation directions in said first and second wires.

14. A CAD apparatus for an LSI or a printed circuit board, comprising:

CAD execution means for designing first and second wires on an LSI or a printed circuit board, wherein a portion of the first wire is adjacent to the second wire;

conversion calculation means for calculating a first conversion wire length of the first wire with respect to the second wire which corresponds to the length of said adjacent portion and respective propagation directions of the first and second wires;

comparison means for comparing said first conversion wire length with a predetermined maximum wire length and providing a corresponding comparison result; and display means for displaying the physical layout of the first and second wires and the comparison result.

15. A wire design apparatus, comprising:

CAD execution means for designing first, second and third wires, wherein a first portion of the first wire is adjacent to the second wire and a second portion of the first wire is adjacent to the third wire;

conversion calculation means for calculating a first conversion wire length of the first wire with respect to the second wire and a second conversion wire length of the first wire with respect to the third wire, wherein each conversion wire length corresponds to the length of each adjacent portion and the signal propagation directions of each wire with respect to the first wire, said conversion calculation means calculating a sum total of the first and second conversion wire lengths;

comparison means for comparing said sum total with a predetermined maximum wire length to determine a comparison result; and display means for displaying the physical layout of the first, second and third wires and the comparison result.

* * * * *